United States Patent [19]

McClure

[11] Patent Number: 5,610,866

[45] Date of Patent: Mar. 11, 1997

[54] CIRCUIT STRUCTURE AND METHOD FOR STRESS TESTING OF BIT LINES

[75] Inventor: David C. McClure, Carrollton, Tex.

[73] Assignee: SGS-Thomson Microelectronics, Inc., Carrollton, Tex.

[21] Appl. No.: 331,699

[22] Filed: Oct. 31, 1994

[51] Int. Cl.$^6$ ............................................. G11C 13/00
[52] U.S. Cl. ........................... 365/201; 365/51; 365/200
[58] Field of Search ................................ 365/201, 51, 200

[56] References Cited

U.S. PATENT DOCUMENTS

| | | | |
|---|---|---|---|
| 4,007,452 | 2/1977 | Hoff | 365/200 |
| 4,233,674 | 11/1980 | Russell et al. | 365/200 |

FOREIGN PATENT DOCUMENTS

| | | | |
|---|---|---|---|
| 480752 | 4/1992 | European Pat. Off. | G11C 29/00 |
| 590982 | 4/1994 | European Pat. Off. | G11C 29/00 |

Primary Examiner—Terrell W. Fears
Attorney, Agent, or Firm—David V. Carlson; Theodore E. Galanthay; Lisa K. Jorgenson

[57] ABSTRACT

A plurality of bit lines is arranged in columns and grouped into a first set of bit lines and a second set of bit lines. Each bit line in the first set of bit lines alternates with each bit line in the second set of bit lines. First switching means electrically connects the first set of bit lines to a first voltage level and, simultaneously, second switching means connects the second set of bit lines to a second voltage level. This permits a bit line stress test that will reveal defects or failures in a memory chip.

25 Claims, 4 Drawing Sheets

FIG. 4

CIRCUIT STRUCTURE AND METHOD FOR STRESS TESTING OF BIT LINES

TECHNICAL FIELD

The present invention relates to the testing of memory devices, and more particularly to the stress testing of bit lines of memory devices.

BACKGROUND OF THE INVENTION

Integrated circuits incorporating memory devices can fail before leaving the manufacturing facility as well as in the field. However, any failure of a memory device presents an unacceptable situation to a user or vendor of a product with a memory device.

A defect in insulation can lead to such failures. For example, in a typical static random access memory cell, two bit lines are connected to each memory cell by pass gate transistors, which are turned on by a word line. The bit lines are usually metallized strips; they must be insulated from each other and from other areas of the memory cell. Oxide layers usually provide such electrical insulation. Unfortunately, defects can develop in the insulating oxide layer between side-by-side metallized strips and also between upper and lower conductive layers. These defects can be the result of a thinning of the oxide and can effectively reduce the distance between conductive layers. Resistive shorts between metallized strips can also occur. Insulation layers between different levels of conductors, such as poly one, poly two and metal can similarly fail and result in failure of the memory device.

It is desirable to perform rapid testing to expose defects in a device before shipping a product with a memory to a vendor or user. Current testing methods include applying voltages to a memory device and writing test patterns. This may not, however, expose all defects in the oxide layers between adjacent bit lines and other conductors. For example, if adjacent bit lines or conductors of a memory device are placed in the same logic state and a resistive short or other defect exists between those adjacent bit lines, then the defect will not be found because there is no stress between them. A weakened dielectric will not be stressed by such a test and may break down after several hours of use in the field. The defect will therefore remain undetected. Thus, there is an unmet need in the art to be able to detect defects associated with bit line performance of a memory device.

SUMMARY OF THE INVENTION

Therefore, it is an object of the present invention to provide a bit line stress test to detect defects between bit lines in a memory device.

It is a further object of the present invention to provide a bit line stress test that places adjacent bit lines of a memory device in opposite states.

The invention provides for these and other objects by providing a circuit structure and method for conducting a bit line stress test in a memory device. The bit lines are stressed by placing adjacent bit lines at different voltage levels. A plurality of bit lines are arranged in columns. The bit lines are grouped into two sets of bit lines, a first set of bit lines and a second set of bit lines. Each bit line in the first set of bit lines alternates with each bit line in the second set of bit lines. This allows each bit line of the first set of bit lines to be adjacent a bit line of the second set of bit lines. Likewise, each bit line of the second set of bit lines is adjacent bit line of the first set of bit lines. First switching means electrically connects the first set of bit lines to a first voltage level corresponding to a first logic state. Simultaneously, second switching circuitry electrically connects the second set of bit lines to a second voltage level corresponding to a second logic state. Adjacent bit lines are held for a selected time at different voltage levels to determine if there is any leakage between them; a weak dielectric that may later break down; or other defects that may be present or may occur in the future because of a weak insulator.

DETAILED DESCRIPTION OF THE INVENTION

Figure 1:
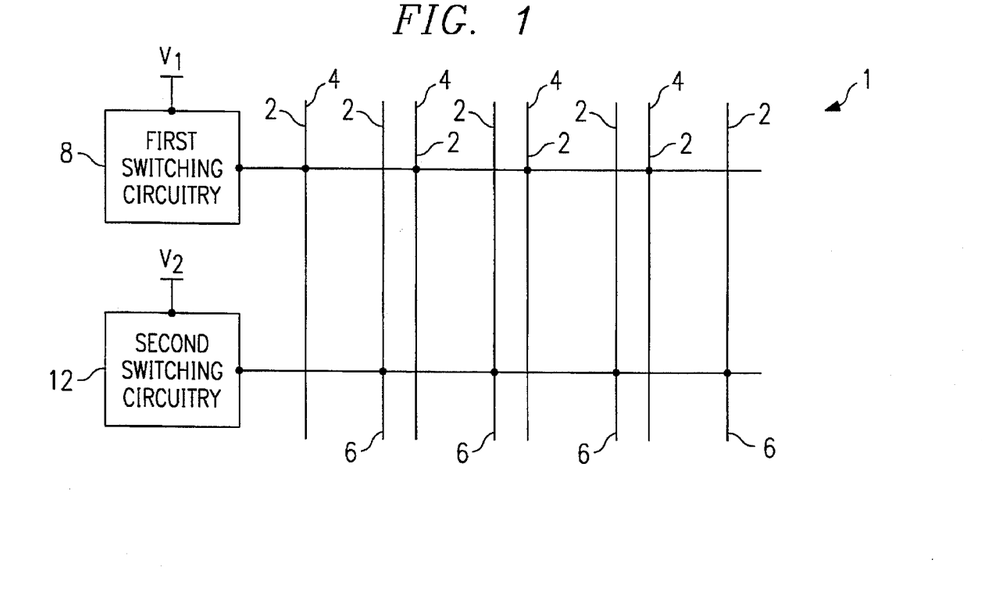
FIG. 1 is a block diagram of a bit line stress test circuit according to the present invention.

FIG. 1 shows an example of an integrated circuit 1 that illustrates a preferred embodiment of the invention. Circuit 1 is a part of an otherwise conventional volatile or nonvolatile memory device (not shown). Memory cell tests of various types are described in applications filed and bearing attorney docket number 93-C-56 filed Dec. 22, 1993, Ser. No. 8/172,854; 94-C-28 filed on Jun. 29, 1994, Ser. No. 08/267,667; and 94-C-67 filed on Sep. 30, 1994, Ser. No. 08/316,087; each incorporated herein by reference.

Bit lines 2 in circuit 1 are arranged in columns. In conventional memories, a plurality of memory cells are arranged in rows and columns. The term "row" refers to the array direction in which memory cells are selected via a word line. The term "column" refers to the array direction in which memory cells in the selected row are selected for reading or writing operations. Further, in conventional memories, each of the memory cells in the selected row are coupled to one bit line or to a complementary pair of bit lines. Such use of the terms rows, columns, and bit lines is contemplated to be consistent with the general understanding in the art.

Bit lines 2 are conventionally fabricated as metallized strips in circuit 1, though they are silicon conductors, poly or substrate, in some memories. An oxide layer, or other suitable insulation layers (not shown), conventionally insulate bit lines 2 from each other, from word lines (not shown), and from other components of circuit 1. This physical layout is well known in the art and conventional layouts and separation of conductors using insulating layers are used, as is known in the art.

According to the invention, bit lines 2 are organized into a first set of it lines 4 and a second set of bit lines 6. As shown in FIG. 1, each bit line 2 in the first set of bit lines 4 alternates with each bit line 2 in the second set of bit lines 6. Thus, a bit line 2 in the first set of bit lines 4 is adjacent a bit line 2 in the second set of bit lines 6. Conversely, a bit line 6 in the second set of bit lines 6 is adjacent a bit line 2 of the first set of bit lines 4. Thus, bit lines 2 are arranged in columns that alternate between bit lines 2 of the first set of bit lines 4 and bit lines 2 of the second set of bit lines 6.

The circuit operates as follows. During the bit line stress test, first switching circuit 8 electrically connects each bit line 2 in the first set of bit lines 4 to a first voltage level $V_1$. First voltage level $V_1$ corresponds to a first logic state. Preferably, the first voltage level is the lowest voltage potential likely to be on the bit line during normal operation, such as 0 volts, ground, virtual ground, or, in some cases, −5 volts. Thus, via first voltage level $V_1$ and first switching circuitry 8, bit lines 2 in the first set of bit lines 4 can be held at a first voltage level for a selected time.

Second switching circuitry 12 electrically connects each bit line 2 in the second set of bit lines 6 to a second voltage level $V_2$. Second voltage level $V_2$ corresponds to a second logic state complementary to the logic state of $V_1$, for example 5 volts, 9 volts or some other value (such as 12 volts for certain nonvolatile memories, PROMs, EEPROMs, etc.) that represents at least the highest voltage the bit line will likely see during chip operation. In some embodiments, a higher voltage than the chip will experienced and normal operation will be used to stress the bit line. A slightly higher voltage will place additional stress on oxide layers and may cause a breakdown of a weak oxide, thus revealing a defect which is not at present cause failure but may become a later failure after some period of operation. For example, 9 volts may be used for a circuit that may see only 5 volts during normal operation.

When first switching circuitry 8 electrically connects bit lines 2 in the first set of bit lines 4 to first voltage level $V_1$ and second switching means 12 simultaneously electrically connects bit lines 2 in the second set of bit lines 6 to second voltage level $V_2$, adjacent bit lines 2 are held at the maximum difference in voltages that could possibly be experienced during chip operation. If desired, the voltage values of $V_1$ and $V_2$ are then changed to place the high potential on the first set of bit lines and the low potential on the second set of bit lines and repeat the test.

If a defect in the oxide insulating bit lines 2 from each other were to cause a resistive short between adjacent bit lines 2, the adjacent bit lines 2 thus shorted together would be placed at approximately the same voltage as each other state. Other defects may also be revealed during this stress test. For example, leakage from a bit line to a memory cell, to ground, or to other circuit elements; error in memory cell electrical connections; etc. A failure in a circuit is when the circuit fails to meet the specifications. A defect is an improper structure that may be a present failure or has the potential to fail in the expected lifetime of the product. For example, a broken oxide that shorts out is a defect that results in a failure. A weak oxide that has not yet broken down is a defect that is not yet a failure. The chip may operate for a brief time at standard voltage and the defect not be manifest as a failure. When the oxide breaks down, it becomes a failure.

Usually, the highest voltage will be higher than what the chip will typically use. The high voltage is selected as fallous: it should be high enough to place some minor additional stress on the insulators between the bit lines and possibly on the insulators above (or below) the bit lines. This stress will cause a breakdown or destruction of a weak or thin oxide, causing it to fail, where previously it was on the verge of failure but had not yet had a failure.

The voltage should not be so high that a standard insulator is destroyed by the test. For example, 9 volts is preferred for a chip that is designed to be operated at 5 volts during normal operation. This bit line stress test is thus effective to reveal present failure and future potential failures.

Sensing circuitry can be used to detect a bit line failure when two adjacent bit lines that should be at different voltage levels during the test are, in fact, at the same voltage level. Other methods to determine failures include performing a reading and writing test to memory cells before and/or after the bit line stress test; measuring the stand-by current during normal chip operation before and/or after the stress test; measuring current flow during the stress test itself; perform a data push out test to determine if data is quickly accessible, etc. Sensing circuitry, such as volt meter off the wafer, at a testing station, connected to the wafer by a known technique using a multipoint probe may detect a voltage drop in a set of bit lines or that both sets of bit lines are at similar voltages, thus revealing a defect. Alternatively, some types of defects may cause excessive current drain from the high voltage supply to the low voltage; this may also be detected by sensing the current flow through the switches during testing and comparing the current flow to a selected threshold during the test. If more rigorous analysis is desired, the current flow of both the high and low voltage supplies can be monitored. If the current drawn by the positive supply is above a threshold amount but the current through the lower supply voltage potential is below the threshold, this will indicate a bit line of the second set connected to a ground through some path. If the current drawn from the positive supply to the second set of bit lines is above a threshold and equals the current on the first set of bit lines, this will indicate a bit line-to-bit line failure.

In most embodiments, the failure sensing equipment will be on test equipment at wafer test stations and the voltages $V_1$ and $V_2$ will be provided from the wafer test probe. Alternatively, circuits on the chip may be configured as the test circuit and indicate an output a logic high or low to indicate the results of the bit line stress test.

Figure 2:
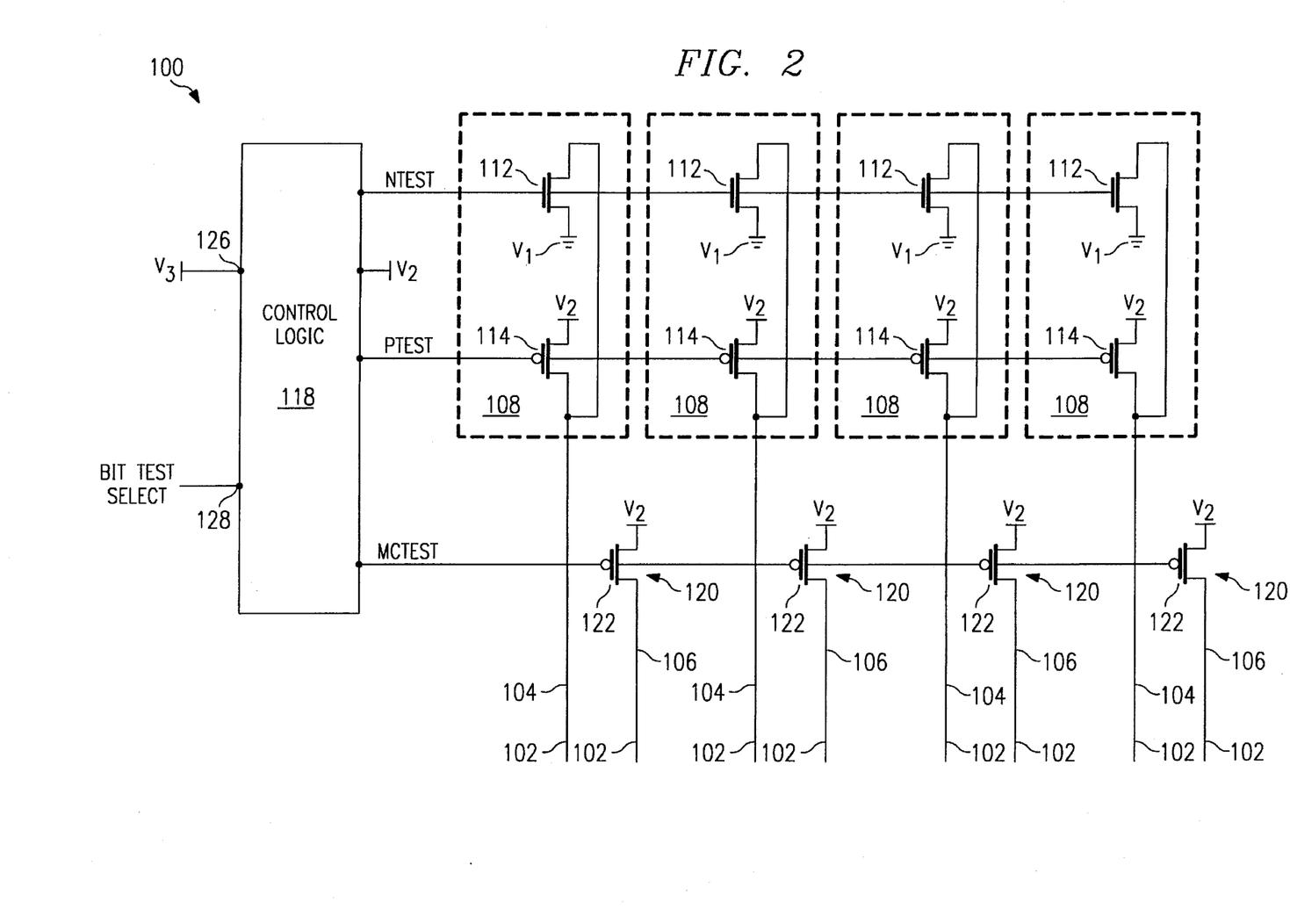
FIG. 2 is a mixed block diagram and schematic circuit diagram of a bit line stress test circuit according to a preferred embodiment of the present invention.

The following discussion explains the structure and operation of a preferred embodiment of the invention as detailed below and as shown in FIG. 2.

Integrated circuit 100 is a portion of a volatile or nonvolatile memory device (not shown). Bit lines 102 are arranged in columns and are realized as metallized strips in circuit 100. Oxide layers (not shown) insulate the bit lines 102 from other circuit members as needed.

The bit lines 102 are grouped into a first set of bit lines 104 and a second set of bit lines 106. Each bit line 102 in the first set of bit lines 104 alternates with each bit line 102 in the second set of bit lines 106. This is a physical arrangement, on the chip layout, thus, bit lines 102 of the first set of bit lines 104 are adjacent bit lines 102 of the second set of bit lines 106. Similarly, bit lines 102 of the second set of bit lines 106 are adjacent bit lines 102 of the first set of bit lines 104.

First switching circuitry 108 are provided to electrically connect the first set of bit lines 104 to a first voltage level $V_1$, preferably the lowest voltage potential likely to be on the bit line during normal operation, usually 0 volts, ground, virtual ground, or, in some cases, −5 volts. First switching circuitry 108 includes a first selection device 112 and a second selection device 114. First selection device 112 has its drain/source, referred to herein as the input connected to $V_1$. First selection device 112 has its source/drain, referred to herein as the output connected to the output of second selection device 114 and is turned on and off responsive to a first signal NTEST. Second selection device 114 is input connected to a second voltage level $V_2$ and is turned on and off responsive to a second signal PTEST. Second voltage level $V_2$ is typically 5 volts, 9 volts, or some other value that represents the highest voltage the bit line will likely see during any part of chip operation. Bit lines 102 in the first set of bit lines 104 are also connected to the output of second selection device 114.

As shown in FIG. 2, first selection device 112 comprises an n-channel transistor and second selection device 114 comprises a p-channel transistor. Control means 118 supplies signal NTEST to first selection device 112 and signal PTEST to second selection device 114, as well as second voltage level $V_2$. In the circuit 100 as shown in FIG. 2, first selection device 112 is turned on when signal NTEST goes high, and second selection device 114 turns off when signal PTEST goes high. First voltage level $V_1$ is thus electrically connected to bit lines 102 in the first set of bit lines 104 when first selection device 112 is turned on and second selection device 114 is turned off.

Second switching circuitry 120 comprises a third selection device 122, shown in FIG. 2 as a p-channel transistor. Third selection device 122 is input connected to second voltage level $V_2$. Bit lines 102 in the second set of bit lines 106 are connected to the output of third selection device 122. Third selection device 122 is turned on and off responsive to a third test signal MCTEST, supplied by control means 118. When third signal MCTEST goes low, third selection device 122 turns on and electrically connects second voltage level $V_2$ to bit lines 102 of the second set of bit lines 106.

In one embodiment, control logic 118 is comprised of logic gates in circuit 100. A test enable pin 126 is brought high, or, alternatively, an externally generated super voltage $V_3$, typically 7 volts, is placed on a first existing pin 126 of control logic 118 to place control means 118 into a test mode. This control logic 118 may be stand alone, dedicated logic or it may be part of the address and decode logic. External signal BIT TEST SELECT, applied to a second existing pin 128 of control logic 118, overrides signals for addressing memory cells and directly accesses signals NTEST, PTEST, and MCTEST. During the bit line stress test, control logic 118 provides test signals NTEST, PTEST, and MCTEST to simultaneously turn on first selection device 112, turn off second selection device 114, and turn on third selection device 122, respectively. Control logic 118 also supplies second voltage $V_2$.

Many memories in use today use a bit line load device coupled to bit lines. Usually, these bit line load devices take the form of transistors such as selection devices 114 and 122. Preferably, bit line load devices already existing in circuit 100 are used as second selection device 114 and third selection device 122. Thus, in a preferred embodiment, the only device that must be added to otherwise conventional circuit 100 is first selection device 112. This adds one transistor to every other bit line. Alternatively, one switching transistor may be positioned as shown for switching circuitry 8 and 12 and a contact made to every other bit line within a block of bit lines, as shown in FIG. 1. If the control logic 118 and other testing circuitry is off chip, no other changes to the chip logic structure need be made. Access to NTEST, PTEST, and MCTEST can be made available at a pads during wafer test that are not wire bonded in the final product. The test is performed by directly applying the voltages using the wafer probe equipment.

First selection device 112 is not limited to an n-channel transistor, and second selection device 114 and third selection device 122 are likewise not limited to p-channel transistors. First selection device 112 may comprise a p-channel transistor, and second selection device 114 and third selection device 122 may comprise n-channel transistors or they may all be n-channel devices. In this case, first selection device 112 turns on when signal NTEST goes low. Second selection device 114 turns off when signal PTEST goes low. Third selection device 122 turns on when signal MCTEST is high.

Figure 3:
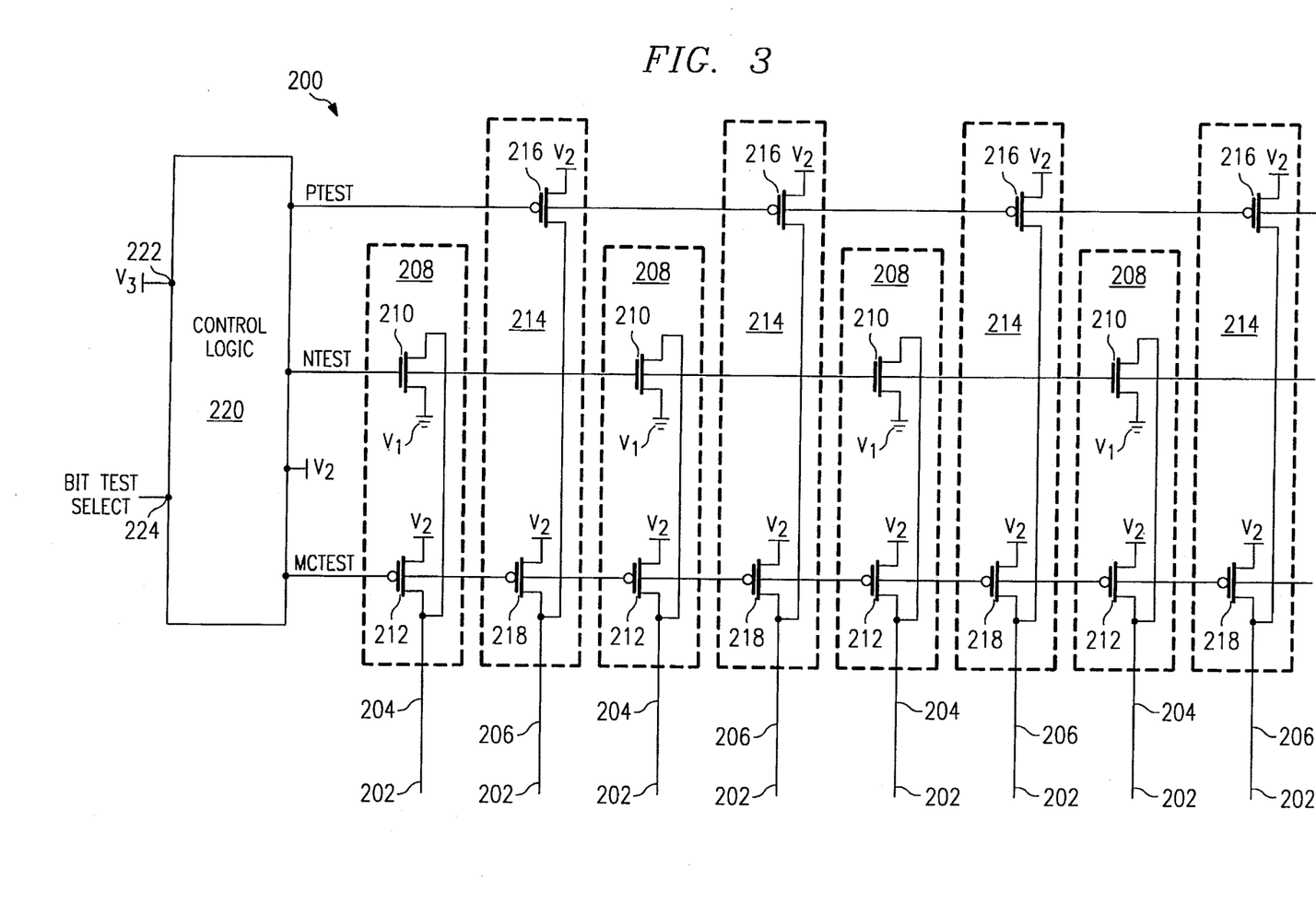
FIG. 3 is a mixed block diagram and schematic circuit diagram of a bit line stress test circuit according to an alternative embodiment of the present invention.

FIG. 3 shows an alternative embodiment of the present invention, that may be preferred for some memory devices. Some memory devices have the bit line load controlled by a common signal line that is coupled to every bit line; thus, two transistors must be added to perform the bit line stress test. In this type of memory, the bit line loads are all turned on or off together for all bit lines during normal chip operation. The alternative embodiment shown in FIG. 3 requires the addition of first selection device 210, as well as third selection device 216 to the otherwise conventional circuit 200 as shown in FIG. 3 to permit specific control of every other bit line.

Figure 4:
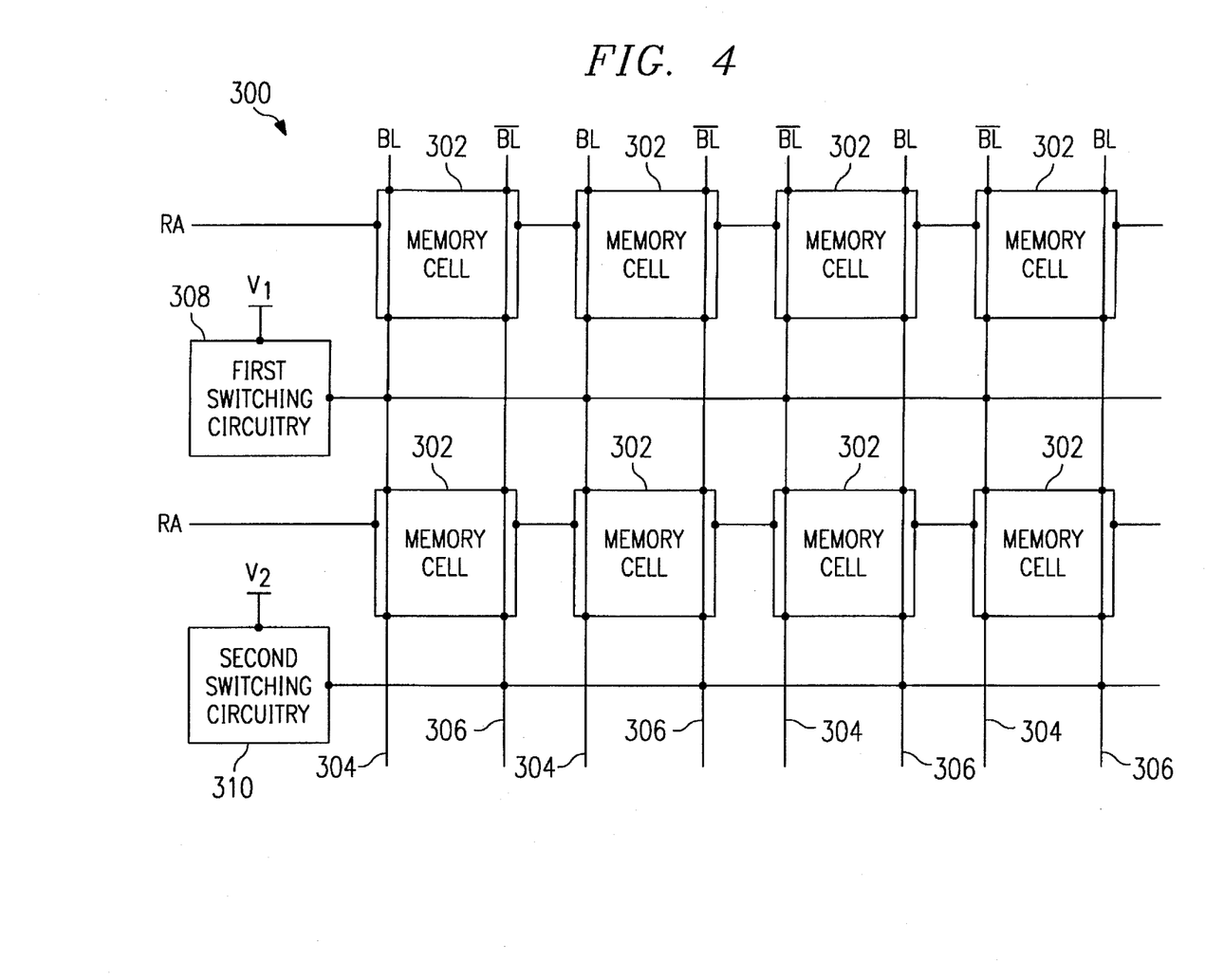
FIG. 4 is a block diagram of a bit line stress test circuit according to the present invention incorporated into an SRAM device.

FIG. 4 shows an example of the present invention incorporated in a static random access memory device. Circuit 300 comprises a plurality of memory cells 302 arranged in rows and columns in a conventional manner. Memory cells 302 are connected to separate complimentary bit lines BL and OVERLINE {BL} arranged in columns. Rows of memory cells 302 are addressed by separate row address lines RA. A sense amplifier (not shown) is connected to the output of each of the columns. Bit lines BL and OVERLINE {BL} are grouped into a first set of bit lines 304 and a second set of bit lines 306. Each bit line in the first set of bit lines 304 alternates with each bit line in the second set of bit lines 306.

The circuit operates as follows. During the bit line stress test, first switching means 308 electrically connects each bit line in the first set of bit lines 304 to a first voltage level $V_1$, corresponding to a first logic state. Preferably, first voltage level $V_1$ is the lowest voltage potential likely to be on the bit line during normal operation, usually 0 volts, ground, virtual ground, or, in some cases, −5 volts.

Second switching means 310 electrically connects each bit line in the second set of bit lines 306 to a second voltage level $V_2$. Second voltage level $V_2$ corresponds to a logic state complementary to the logic state of the first voltage level $V_1$ and is typically 5 volts, 9 volts, or some other value that represents the highest voltage the bit line will likely see during any part of chip operation.

When first switching means 308 electrically connects bit lines in the first set of bit lines 304 to first voltage level $V_1$ and second switching means 310 simultaneously electrically connects bit lines in the second set of bit lines 306 to second voltage level $V_2$ adjacent bit lines are held at the maximum difference in voltage that could possibly be experienced during chip operation.

Figure 5:
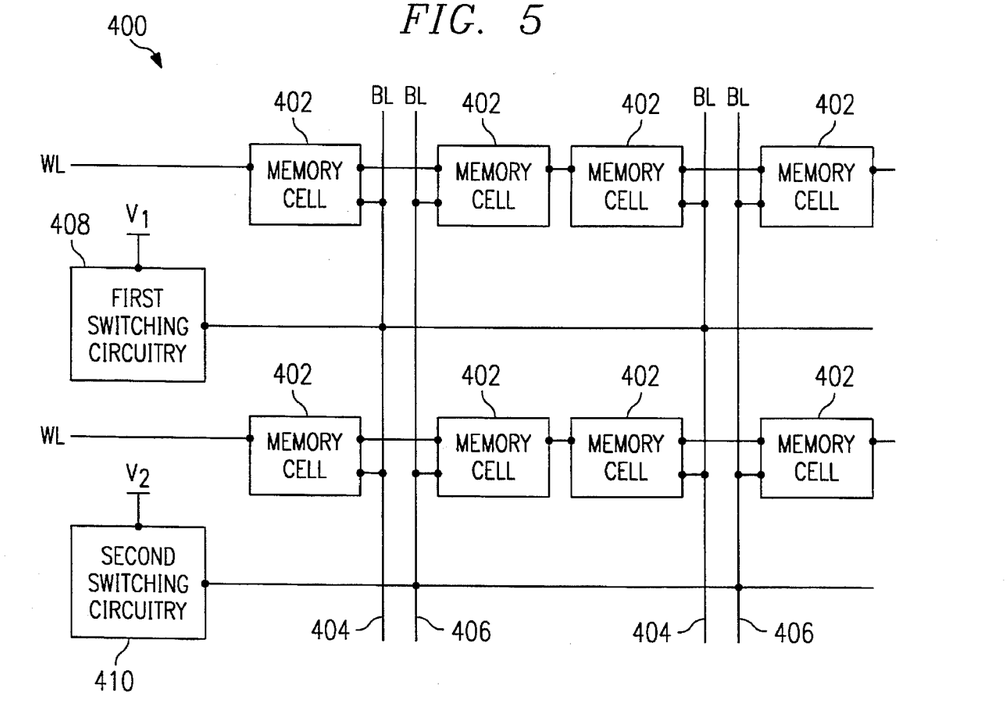
FIG. 5 is a block diagram of a bit line stress test circuit according to the present invention incorporated into a DRAM or non-volatile memory device.

FIG. 5 shows the present invention incorporated into a circuit 400 comprising a plurality of memory cells 402 arranged in rows and columns. Memory cells 402 may be a dynamic random access memory cell, a ROM, a PROM, an EPROM, an EEPROM, or a flash EPROM. Each memory cell 402 in a column is conventionally connected to a single bit line BL. Rows of memory cells 402 are conventionally accessed by word lines WL.

Bit lines BL are arranged in columns and are grouped into a first set of bit lines 404 and a second set of bit lines 406. Each bit line BL in the first set of bit lines 404 alternates with each bit line BL in the second set of bit lines 406. The bit lines may be of the folded bit line type used in many DRAMs, the single bit line per column of ROMs, EEPROMs, etc. or any other bit line arrangement.

First switching means 408 electrically connects the first set of bit lines 404 to a first voltage level $V_1$, the lowest voltage potential likely to be on the bit line during normal operation, usually 0 volts, ground, virtual ground, or, in some cases, −5 volts.

Second switching means 410 electrically connects each bit line BL in the second set of bit lines 406 to a second voltage level $V_2$, typically 5 volts, 9 volts, or some other value that represents the highest voltage the bit line will likely see during any part of chip operation.

When first switching means 408 electrically connects bit lines BL in the first set of bit lines 404 to first voltage level $V_1$ and second switching means 410 simultaneously electrically connects bit lines BL in the second set of bit lines 406 to second voltage level $V_2$, adjacent bit lines BL are held at the maximum difference in voltage that could possibly be experienced during chip operation.

The first and second switching circuits of FIGS. 4 and 5 can be implemented as shown in FIGS. 2 or 3 or by any other suitable technique. In FIG. 4, the second switching circuitry will usually be the existing bit line load devices. Usually, the word lines are held off during the bit line stress test. Leaving the word lines off is not mandatory for all testing sequences, particularly for some RAM or EEPROM designs, as will be explained. Having the word lines off makes the test much faster than writing data to every memory cell. Also, from some RAM designs, it permits a more reliable test of the bit lines themselves. Other tests may be performed for testing memory cell performance, as has been described in the copending application incorporated herein by reference.

The voltages $V_1$ and $V_2$ are selected at any desired value for the test. While they will usually be at least the highest and lowest voltages the bit line is expected to be exposed to during operation, they may be higher and lower, respectively, to provide additional stress testing, if desired.

As will be appreciated, many memories have the bit lines organized in a particular physical layout. In SRAMs, for example, the bit lines are laid out in pairs, with a true bit line and a complement bit line for each memory cell. For two-bit lines connected to one memory cell, the logic level of the adjacent bit lines will always be opposite during a write mode; however, the adjacent bit lines from adjacent memory cells may be at the same state during normal operation. Many SRAMs have the bit lines physically laid out with true complement pairs that alternate location every other bit line pair. (This can be seen in FIG. 4.) Thus, the writing of a "1" or "0" to the entire array will not ensure that adjacent bit lines from adjacent memory cells are at different voltages. By adding one transistor to every other bit line, according to its physical layout position in the array, whether a true or complement bit line, the bit line stress test can ensure that every other bit line can be placed at a first voltage level while the other alternating bit lines in the physical layout are placed at a second voltage level, such as ground. DRAMs have only one bit line per cell but many use a folded bit line structure. EEPROMs, ROMs, etc. also have only one bit line per memory cell. In either case, one aspect of the invention is that every other bit line is placed at a different voltage than the adjacent bit lines according to their physical position in the layout.

This invention is particularly useful for testing memories on board chips having significant other circuits or logic on the same chip. The RAM, EEPROM, or ROM memory on a microprocessor can be organized for quick and easy testing using this invention. Testing the memories on these chips have traditionally been very difficult. According to the invention, one extra transistor is added to every other bit line and then the bit line stress test is conducted under control of the CPU on the same silicon substrate, using the logic gates and control circuitry of that CPU under software code control. Thus, the control logic 118 is part of the CPU or some other logic on the chip.

In one embodiment, the software code to conduct the test on the memory can be written into the memory itself. The CPU can access the memory, read the stored code and conduct the tests on that memory that have been stored therein. In this way, the memory testing can be tailored for each individual device, depending on its memory layout and design. Of course, if the memory is a RAM, EEPROM, etc., the test program can then be cleared and then data or program instructions stored therein for general chip operation.

In one embodiment, the RAM memory on chip is used to store the program for the self-test of all memories on that same chip, whether they be ROM, PROM, EEPROM, or the RAM itself. The test program is then cleared. This has the advantage of being a simultaneous dual test showing that the memory and CPU can operate together, execute instructions, one type of test; and it also performs a memory reliability test, a second type of test. Of course, the testing of memory on-board a CPU chip can be done under control of external software, wafer probes at test stations, test equipment or the like as been explained.

One advantage of the present invention is the speed at which memories can be tested. The bit line stress test can be conducted very rapidly as compared to other full scale testing. The bit lines are tested all at once for the whole chip or in large groups or subgroups at the same time.

This testing is performed at wafer sort, which provide access directly to $V_2$ and also possible $V_1$, N test, P test, and/or MC Test as needed. This permits higher voltages to be used than the rest of the chip can safely handle. Usually, the word lines are off and actual reading and writing to the memory cells is not performed, resulting in a much faster test. Alternatively, this is particularly helpful on memory arrays having one bit line per memory cell. This permits an alternating "1" and "0" pattern to be written to the entire array very quickly during water sort, before packaging. The writing pattern is thus very quickly performed at wafer sort and failed chips are not packaged. After packaging, only a few additional test need be performed on the ready-to-ship chip because some writing and reading tests have been done. Thus, this test may be used to replace, at least in part, the post-package, time-consuming global testing of: writing a test "1" to every cell then reading from each cell; then writing a "0" to every cell followed by reading, then writing and reading "1" and "0" to every cell in every other column and then, finally writing and reading a "0" and "1" to every cell in every other column. Such tests are very time-consuming on large memories, such as a 64 Meg. SRAM; a 256 Meg. DRAM; 256 Meg. EEPROM; and larger devices as they become available. This test will thus shorten the overall testing time; reduce failures in the field, reduce burn-in of packaged units; increase reliability because parts with weakness or failures that are not with defects can be detected and repaired or removed from the manufacturing cycle before being packaged. This test may also produce "known good die" before packaging.

While the invention has been particularly shown and described with reference to a preferred embodiment, those

I claim:

1. A circuit comprising:
   a plurality of bit lines arranged in columns, said bit lines being grouped into a first set of bit lines and a second set of bit lines, each bit line in said first set of bit lines being in an alternating position with respect to each bit line in said second set of bit lines;
   first switching means for electrically connecting only said first set of bit lines to a first voltage level while simultaneously having said second set of bit lines at a second voltage level different from the first voltage level; and
   second switching means for electrically connecting only said second set of bit lines to said second voltage level simultaneously with said first switching means connecting said first set of bit lines to said first voltage level.

2. The structure of claim 1 wherein said first voltage is ground.

3. The structure of claim 1 wherein said second voltage level is higher than the voltage applied to said bit lines during normal operation.

4. The structure of claim 1, further comprising:
   control means adapted to provide a first test signal to said first switching means, said first switching means electrically connecting said first set of bit lines to said first voltage level responsive to said first test signal, said control means providing a second test signal to said second switching means, said second switching means electrically connecting said second set of bit lines to said second voltage level responsive to said second test signal.

5. The structure according to claim 4 wherein the control means includes logic circuitry on the same substrate as the bit lines.

6. The structure according to claim 4 wherein the control means includes logic circuitry at a testing station and voltages $V_1$ and $V_2$ and signals N test is provided by a wafer test probe.

7. The structure of claim 4 wherein said first switching means includes a first selection device having an input connected to said first voltage level and having an output connected to said bit lines of said first set of bit lines, said first selection device electrically connecting said bit lines of said first set of bit lines to said first voltage level when enabled by said first test signal.

8. The structure of claim 7 wherein said control means outputs a third test signal to said first switching means, and said first switching means further comprises a second selection device input connected to said second voltage level, said second selection device having its output connected to said bit lines of said first set of bit lines, said second selection device electrically disconnecting said second voltage level from said bit lines of said first set of bit lines responsive to said third test signal.

9. The structure of claim 8 wherein said second selection devices includes a bit line load device.

10. The structure of claim 9 wherein said control means provide said third test signal to said second switching means, and said second switching means further comprise a third selection device input connected to said second voltage level, said third selection device being output connected to said bit lines of said second set of bit lines, said third selection device electrically disconnecting said second voltage level from said bit lines of said second set of bit lines responsive to a test signal.

11. The structure of claim 1, further comprising:
    a plurality of memory cells arranged in rows and columns, each memory cell of an individual column of said memory cells being connectable to an individual bit line.

12. The structure of claim 1, further comprising:
    a plurality of memory cells arranged in rows and columns, each memory cell of an individual column of said memory cells being connectable to a bit line in said first set of bit lines, each memory cell of an individual column of said memory cells further being connectable to a bit line in said second set of bit lines, said bit line in said second set of bit lines being spaced adjacent said bit line in said first set of bit lines.

13. A circuit comprising:
    a plurality of bit lines arranged in columns, said bit lines being physically laid out with bit lines adjacent each other in a column arrangement;
    a first voltage source switch connected to only every other bit line of the set and connected to a first voltage source for selectively connecting only every other bit line to a first voltage level; and
    a second voltage source switch connected to only each of the other ones of the plurality of bit lines that are physically positioned in between every other bit line and connected to a second voltage source for selectively connecting only every other bit line to a second voltage level such that every bit line is coupled for being selectively connected to a voltage level different than the voltage level of an adjacent bit line.

14. The circuit according to claim 13, further including:
    control logic on the chip connected to the first and second switches and selectively enabling the switches to connect every bit line to a voltage potential different than the voltage potential of an adjacent bit line.

15. The circuit according to claim 13 in which the bit lines are in a memory array that is a static random access memory having two bit lines for each memory cell and the bit lines are stressed by placing each bit line at a different voltage potential than physically adjacent bit line to perform stress testing.

16. The circuit according to claim 13, further including:
    logic control circuitry off of the chip to selectively control the first and second switches; and
    sensing circuitry off of the chip to sense whether the bit lines are defective.

17. The circuit according to claim 13 wherein the second voltage level is equal to the highest voltage level for the circuit during normal operation.

18. The circuit according to claim 13 wherein the second voltage level exceeds the highest voltage level for the circuit during normal operation.

19. The circuit according to claim 13 in which all bit lines on the entire chip are tested simultaneously.

20. The circuit according to claim 13 in which the bit lines are part of a DRAM memory structure having one bit line per memory cell.

21. A method of testing bit lines arranged in columns, comprising the steps of:
    connecting only a first set of bit lines to a first voltage level;
    simultaneously connecting only a second set of bit lines that alternate in physical position in a memory array with the bit lines of the first set to a second voltage level; and sensing to determine if a failure is present in the first or second set of bit lines.

22. The method according to claim 14 wherein the sensing step includes:

sensing the current flow through the first and second bit lines to determine if the current flow is above or below a threshold level.

23. The method according to claim 21 wherein said first voltage level is ground and said second voltage level is a positive voltage higher than ground.

24. The method according to claim 23 further including:

providing said first voltage from a voltage source outside of said wafer;

providing said second voltage from a voltage source outside of said chip.

25. The method according to claim 21 wherein said second voltage level is a second predetermined value and further including the step of:

applying a third voltage level to said bit lines during normal operation, said third voltage level being lower than said second voltage level and the third voltage level being the voltage level used when storing a high value in a memory cell to which said bit lines are connected.

* * * * *